(12) United States Patent
Kim et al.

(10) Patent No.: US 8,759,864 B2
(45) Date of Patent: Jun. 24, 2014

(54) LUMINANCE-ENHANCING POLARISING PLATE FOR AN ORGANIC LIGHT-EMITTING ELEMENT

(71) Applicant: LG Chem, Ltd, Seoul (KR)

(72) Inventors: Sin-Young Kim, Daejeon (KR); Hyuk Yoon, Gyeonggi-do (KR); Moon-Soo Park, Daejeon (KR); Belyaev Sergey, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/708,634

(22) Filed: Dec. 7, 2012

(65) Prior Publication Data

US 2013/0099219 A1 Apr. 25, 2013

Related U.S. Application Data

(63) Continuation of application No. 12/866,193, filed as application No. PCT/KR2009/002704 on May 22, 2009, now Pat. No. 8,338,823.

(30) Foreign Application Priority Data

May 22, 2008 (KR) .................. 10-2008-0047717
May 21, 2009 (KR) .................. 10-2009-0044511

(51) Int. Cl.
*H01L 33/00* (2010.01)
*H01L 51/00* (2006.01)
*G02B 5/30* (2006.01)

(52) U.S. Cl.
USPC .... 257/98; 257/40; 257/E33.067; 359/485.03

(58) Field of Classification Search
CPC . H01L 51/5262; H01L 51/5281; H01L 51/50; H01L 3/58; G02B 5/3008; G02B 5/3033; G02B 27/28

USPC ................ 257/40, 98, E33.057; 359/485.03, 359/486.01, 487.01, 487.02
See application file for complete search history.

(56) References Cited

U.S. PATENT DOCUMENTS

| | | |
|---|---|---|
| 6,841,803 B2 | 1/2005 | Aizawa et al. |
| 2002/0061468 A1 | 5/2002 | Konuma |
| 2003/0161136 A1 | 8/2003 | O'Connor et al. |
| 2005/0088590 A1 | 4/2005 | Li et al. |
| 2005/0141086 A1 | 6/2005 | Maruta et al. |
| 2005/0207008 A1 | 9/2005 | Hsu et al. |
| 2007/0085476 A1 | 4/2007 | Hirakata et al. |
| 2007/0147066 A1 | 6/2007 | Boyd et al. |
| 2007/0285000 A1 | 12/2007 | Lim et al. |
| 2011/0036625 A1 | 2/2011 | Narahashi et al. |

FOREIGN PATENT DOCUMENTS

| | | |
|---|---|---|
| CN | 1637587 A | 7/2005 |
| CN | 1851539 A | 10/2006 |
| JP | 2003-186413 A | 7/2003 |
| JP | 2004-205702 A | 7/2004 |
| JP | 2005-100789 A | 4/2005 |
| JP | 2005-128474 A | 5/2005 |
| JP | 2007-141824 A | 6/2007 |
| JP | 2007-227273 A | 9/2007 |

*Primary Examiner* — Nikolay Yushin
(74) *Attorney, Agent, or Firm* — McKenna Long & Aldridge LLP

(57) ABSTRACT

There is provided a polarizer for organic light emitting diodes (OLED) having improved brightness. The polarizer, which comprises a linear polarizer and a ¼ retardation plate, comprises a reflective polarizer film disposed between the linear polarizer and the ¼ retardation plate and transmitting a polarized light horizontal to the transmission axis of the linear polarizer while reflecting a polarized light vertical to the transmission axis of the linear polarizer. The polarizer may be useful to highly improve the brightness of the OLED device when the polarizer is used in the OLED device.

5 Claims, 4 Drawing Sheets

LUMINANCE-ENHANCING POLARISING PLATE FOR AN ORGANIC LIGHT-EMITTING ELEMENT

This application is a Continuation of U.S. patent application Ser. No. 12/866,193, filed on Aug. 4, 2010, which is a National Stage entry of International Application No. PCT/KR2009/002704, filed on May 22, 2009, which claims priority to Korean Application No. 10-2008-0047717, filed on May 22, 2008, and Korean Application No. 10-2009-0044511, filed on May 21, 2009, all of which are hereby incorporated by reference in their entireties.

TECHNICAL FIELD

The present invention relates to a polarizer for organic light emitting diodes (OLED), and more particularly, to a polarizer that is developed to highly improve the brightness of the OLED.

BACKGROUND ART

An organic light emitting diode (OLED) refers to 'a spontaneously light-emitting organic material' that emits light by using electroluminescence where a fluorescent organic compound is allowed to emit light when an electric current is applied to the fluorescent organic compound. This OLED may be driven at a relatively low voltage and manufactured with a small thickness, and has a wide viewing angle and a swift response time as well. Therefore, the OLED has advantages in that, unlike the liquid crystal displays (LCD), it has an unchanged image quality and no image sticking even when seen right by the side, and may realize its full coloration as well. Therefore, the OLED has a high potential as one of leading devices of the next-generation flat panel display.

Such an OLED is generally formed by sequentially stacking an anode (ITO layer), an electron injection layer, an electron transport layer, an emissive layer, a hole transport layer, a hole injecting layer and a cathode on a transparent substrate. Here, electrons start to move when a voltage is applied to the OLED. In this case, in the cathode, the electrons move to the emissive layer by the aid of the electron transport layer. On the while, in the anode, holes from which electrons are escaped move to the emissive layer by the aid of the hole transport layer. When the electrons and the holes run into each other at the organic emissive layer, they are combined to form excitons having a high energy potential. The excitons emit light while dropping to a low energy level.

In order to facilitate the injection of electrons and improve the luminous efficiency, metals such as magnesium, magnesium-silver alloy, aluminum, lithium aluminum alloy and calcium have been generally used in OLED to form the cathode. However, when light is incident from the outside of the OLED, some of the incident light is reflected on the metallic cathode since the metallic cathode has a high surface reflectance. This internal reflection causes problems associated with the degradations in contrast and visibility of the OLED.

Therefore, a circular polarizer including a linear polarizer and a ¼ retardation plate has been used in the art to compensate for this degraded contrast of the OLED. However, the conventional circular polarizer has a problem in that, although it is used to improve the contrast, its transmittance is dropped by below 45% due to the absorption of light by the circular polarizer, which leads to the significantly degraded brightness of the OLED.

In the conventional OLED devices, leading factors that degrade the brightness of the OLED may be the total internal reflection caused by the difference in refractive indexes of respective layers constituting the OLED, the polarization (light absorption) by the circular polarizer, etc. Light emitted from the emissive layer of the OLED may be reduced in brightness by the reflection (i.e. total internal reflection) while being passed through the hole transport layer, the hole injecting layer, the anode and the transparent substrate, and be finally reduced in brightness by 10% or less while being passed through the circular polarizer, which leads to low light emission efficiency.

In order to solve these problems regarding the degraded brightness, a method of optically modifying a transmission path inwards the OLED device or using special substances at respective layers has been under consideration, but this alternative method has problems in that it is difficult to be put to practical use due to the inefficient process and low yield, and thus due to high manufacturing costs.

DISCLOSURE

Technical Problem

The present invention is designed to solve some of the problems of the prior art, and therefore it is an object of the present invention to provide a polarizer for organic light emitting diodes (OLED) having improved brightness, which is able to enhance a contrast ratio of the OLED and highly improve the brightness as well.

Technical Solution

According to an aspect of the present invention, there is provided a polarizer for organic light emitting diodes (OLED) having improved brightness, which includes a linear polarizer and a ¼ retardation plate, including a reflective polarizer film disposed between the linear polarizer and the ¼ retardation plate and transmitting a polarized light horizontal to the transmission axis of the linear polarizer while reflecting a polarized light vertical to the transmission axis of the linear polarizer.

In this case, one or more adhesive layers may be present on the top and bottom of the reflective polarizer film. Here, at least one out of the adhesive layers may be formed of a color compensation adhesive for decreasing the reflectance of external light.

Also, the color compensation adhesive may include an adhesive resin and a light absorbing agent. Here, the adhesive resin is selected from the group consisting of an acryl-based resin, a urethane-based resin, a polyisobutylene-based resin, a styrene-butadiene rubber (SBR)-based resin, a rubber-based resin, a polyvinylether-based resin, an epoxy-based resin, a melamine-based resin, a polyester-based resin, a phenol-based resin, a silicon-based resin, or copolymers thereof, and the light absorbing agent may include a black dye.

According to another aspect of the present invention, there is provided an OLED device including the polarizer for OLED as described above.

Advantageous Effects

The polarizer for OLED according to one exemplary embodiment of the present invention may be useful to enhance a contrast ratio of the OLED and highly improve the brightness as well by disposing a reflective polarizer film between the linear polarizer and the ¼ retardation plate, the reflective polarizer film being able to selectively transmit a linearly polarized light.

Also, the polarizer for OLED according to one exemplary embodiment of the present invention may be useful to decrease the reflectance of external Light in order to improve the contrast ratio of the OLED by forming an adhesive layer on the top or bottom of the reflective polarizer film, the adhesive layer being formed of a color compensation adhesive and including a light absorbing agent.

BEST MODE

Hereinafter, exemplary embodiment of the present invention will be described in detail with reference to the accompanying drawings.

Figure 1:
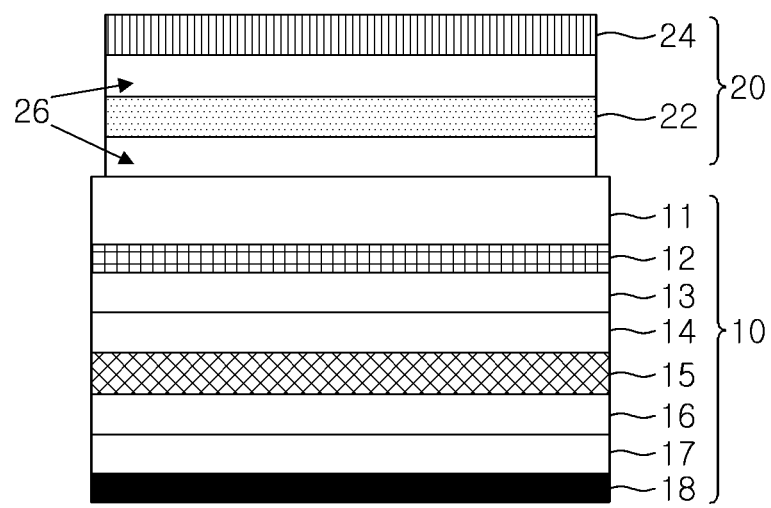
FIG. 1 is a schematic diagram illustrating a configuration of a conventional OLED panel.
Figure 2:
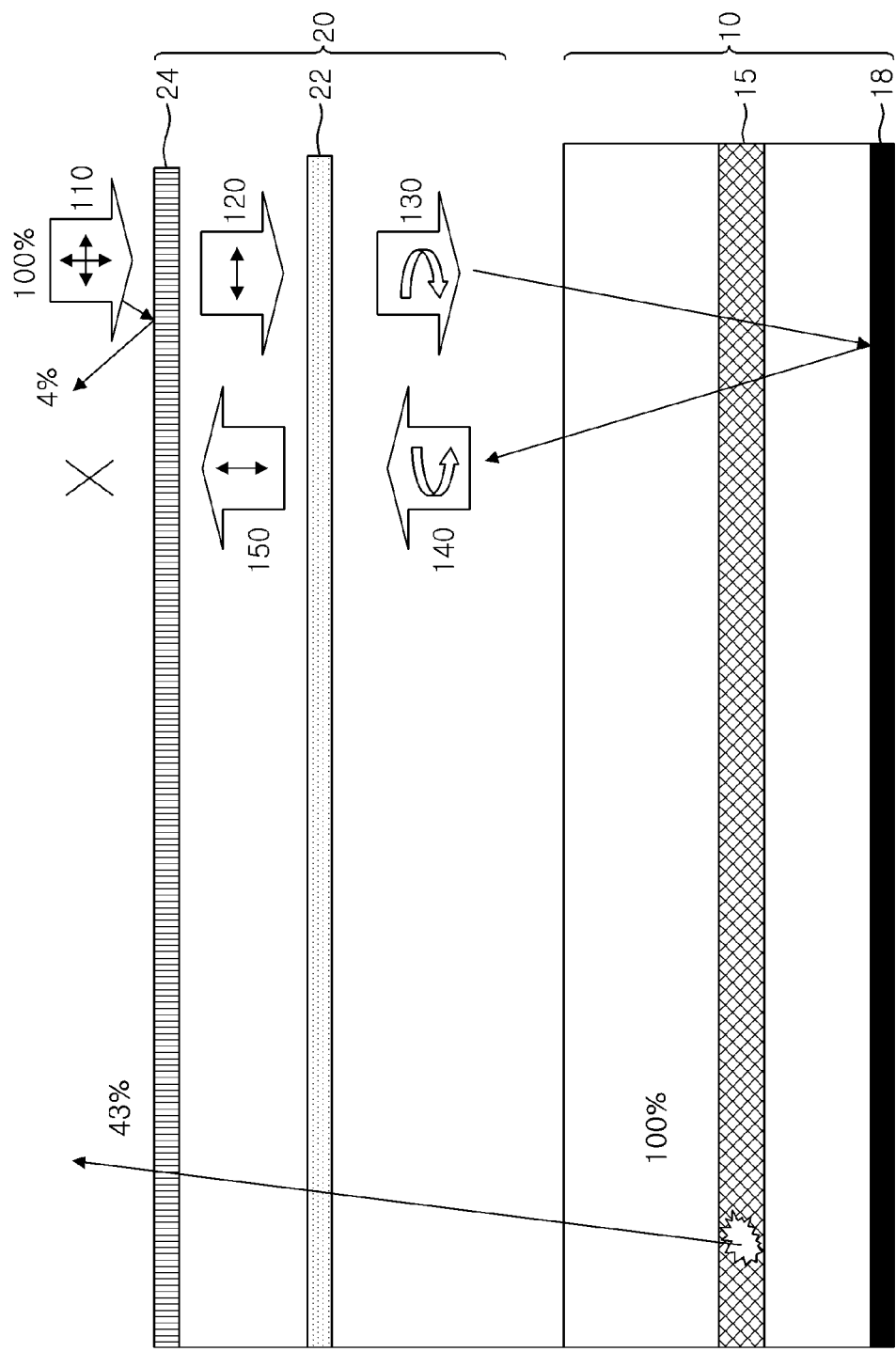
FIG. 2 is a diagram illustrating the progress of light in the conventional OLED panel.

FIG. 1 is a schematic diagram illustrating a configuration of a conventional organic light emitting diode (OLED) provided with a circular polarizer, and FIG. 2 is a diagram illustrating the transmission of light in the conventional OLED panel provided with the circular polarizer. As shown in FIG. 1, a circular polarizer 20 consisting of a linear polarizer 24 and a ¼ retardation plate 22 is attached to an outer surface of a transparent substrate 11 of the conventional organic light emitting diode 10 in order to intercept the reflection of external light. In the conventional OLED panel thus configured, an externally incident light 110 is linearly polarized in a certain direction while being passed through a linear polarizer 24, and the linearly polarized light 120 is converted into a circularly polarized light 130 while being passed through a ¼ retardation plate 22. Meanwhile, a rotation direction of the circularly polarized light is reversed (a reversed polarized light 140) while this circularly polarized light is being reflected on a metallic cathode 18, and the circularly polarized light is also converted into a linearly polarized light 150 while penetrating a ¼ retardation plate 22. In this case, since a rotation direction of the reflected light is reversed, the light after the penetration of the ¼ retardation plate becomes the linearly polarized light 150 having a polarization plane vertical to the original polarization plane. As a result, the light is not transmitted outwards since the light absorbs into the linear polarizer 24 without the penetration of the linear polarizer 24 (see FIG. 2).

Meanwhile, light emitted from an emissive layer of the OLED also penetrates the circular polarizer 20. Approximately 57% of the emitted light absorbs into a circular polarizer 20 while penetrating the circular polarizer 20, and thus the intensity of the penetrated light accounts for approximately 43% of the total intensity of light. Also, the light emitted from the emissive layer is passed through a hole transport layer, a hole injecting layer, an anode, a transparent substrate and the like prior to passing through the circular polarizer. In this procedure, the loss of light may occur due to the total internal reflection caused by the difference in refractive index of respective layers. Therefore, the finally penetrated light is substantially dropped to a very low level (i.e. 10% or less) of the light emitted from the emissive layer.

The present inventors have repeatedly made attempts to solve the above problems, and found that the brightness of OLEDs may be highly improved by applying a reflective polarizer film between the linear polarizer and the ¼ retardation plate, wherein the reflective polarizer film is used to selectively transmit a linearly polarized light while reflect the other light. Therefore, the present invention is completed on the basis of the above facts.

Figure 3:
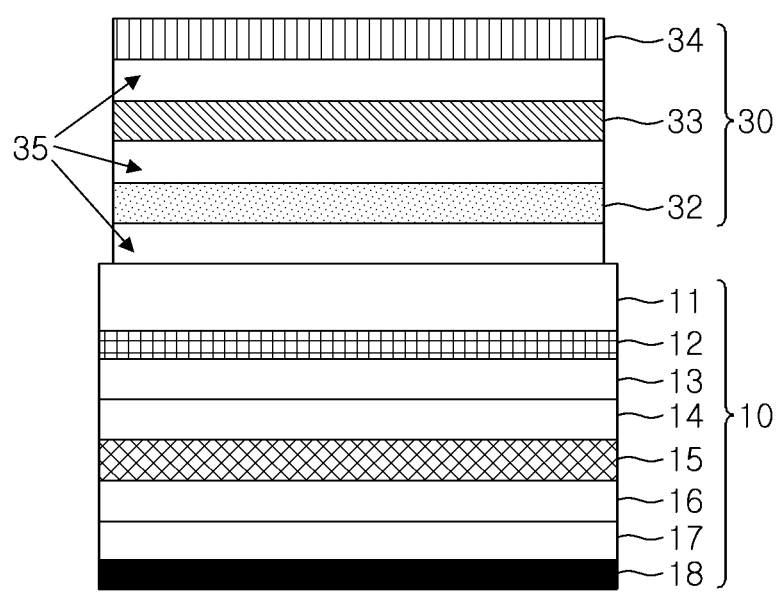
FIG. 3 is a diagram illustrating a configuration of an OLED panel according to one exemplary embodiment of the present invention.

FIG. 3 is a schematic diagram illustrating a configuration of an OLED panel including a polarizer 30 according to one exemplary embodiment of the present invention.

As shown in FIG. 3, the polarizer 30 according to one exemplary embodiment of the present invention includes a linear polarizer 34, a reflective polarizer film 33 and a ¼ retardation plate 32. Here, one or more adhesive layers may be formed among the linear polarizer 34, the reflective polarizer film 33 and the ¼ retardation plate 32. The linear polarizer 34 and the ¼ retardation plate used in the present invention are identical to those used in the conventional circular polarizer. That is, the linear polarizer and the ¼ retardation plate include all of linear polarizers and ¼ retardation plates used in the art, respectively.

Next, the reflective polarizer film 33 is a film that is used to transmit a certain polarized light component and reflect the other polarized light components. Here, a wire grid polarizer, an LCD brightness-enhancing film, a cholesteric liquid crystal film and the like may be used as the reflective polarizer film 33. The reflective polarizer film, through which a polarized light component passed through the linear polarizer is penetrated and on which the other polarized light components are reflected, is used in the present invention, and may be configured with the above-mentioned films.

Figure 4:
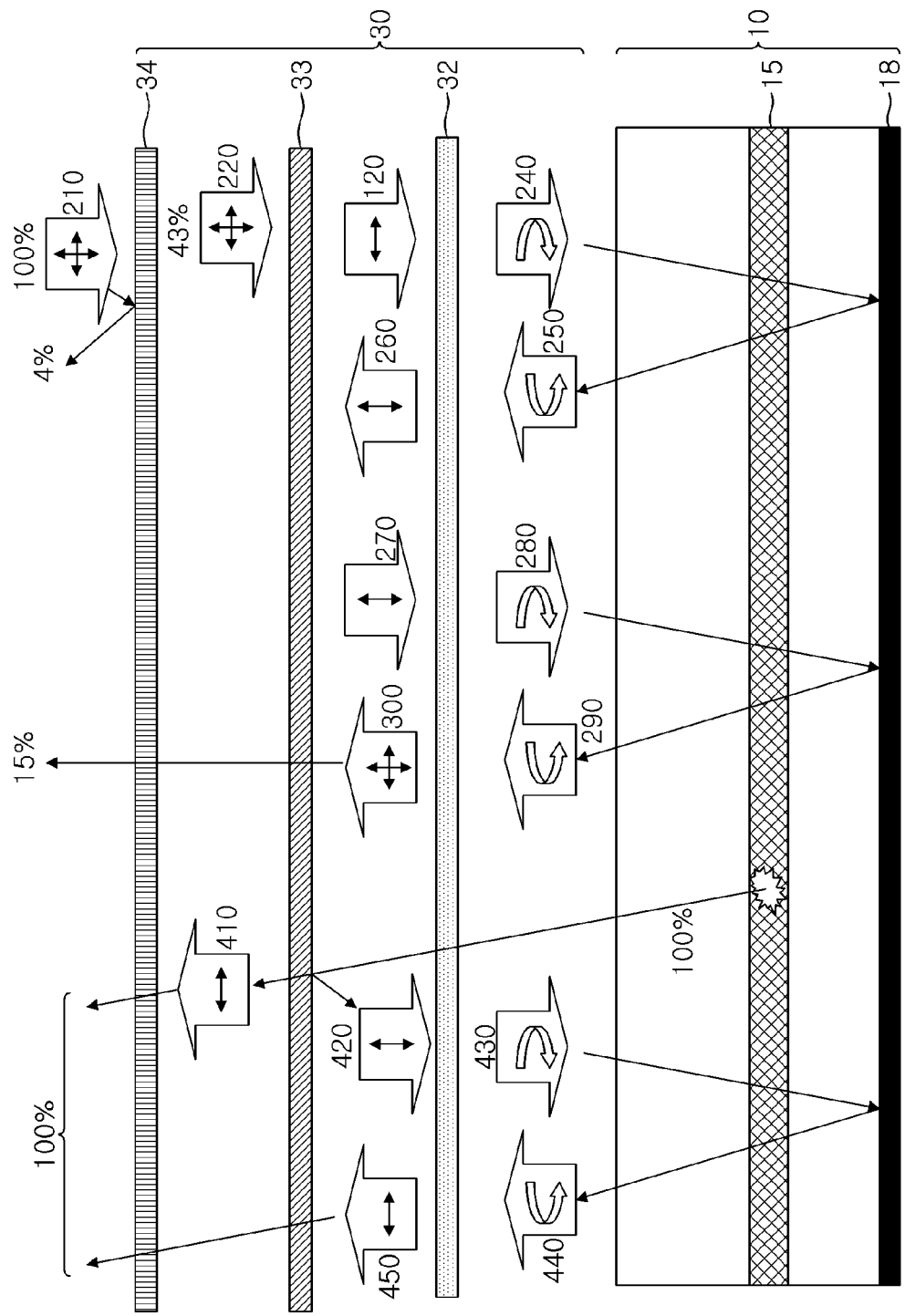
FIG. 4 is a diagram illustrating the progress of light in the OLED panel according to one exemplary embodiment of the present invention.

When the reflective polarizer film 33 that selectively transmits or reflects the linearly polarized light is disposed between the linear polarizer 34 and the ¼ retardation plate 32 according to the present invention, the progress of light is described referring to FIG. 4.

First, the progress of externally incident light in the OLED according to one exemplary embodiment of the present invention is described in more detail. It is assumed that the total intensity of externally incident light 210 is 100% as shown in FIG. 4, approximately 4% of the externally incident light 210 is reflected on a surface of the linear polarizer 34, and the other approximately 96% of the externally incident light 210 is passed through the linear polarizer 34. While the externally incident light 210 is passed through the linear polarizer 34, approximately 53% of the externally incident light 210 absorbs into the linear polarizer 34, and approximately 43% of the externally incident light 210 is passed through the linear polarizer 34. Therefore, the externally incident light 210 is converted into a linearly polarized light 220. The linearly polarized light 220 is passed through the reflective polarizer film 33, and the linearly polarized light 230 is then passed through the ¼ retardation plate 32. When linearly polarized light 230 is passed through the ¼ retardation plate 32, the linearly polarized light 230 is converted into a circularly polarized light 240, and the circularly polarized light 240 is passed through respective layers of the OLED, and is then reflected on the cathode 18. In this case, a rotation direction of the circularly polarized light 240 reflected on the cathode 18 is reversed (a reversed circularly polarized light 250). Then, the reversed circularly polarized light 250 is converted into a linearly polarized light 260 while being passed through the ¼ retardation plate 32. In this case, the linearly polarized light 260 becomes a linearly polarized light having a polarization plane vertical to the original polarization plane. As a result, the linearly polarized light is reflected on the reflective polarizer film 33 (a reflected light 270) without the penetration of the reflective polarizer film 33. The reflected light 270 is converted into a circularly polarized light 280 while being re-passed through the ¼ retardation plate 33. Then, the circularly polarized light 280 proceeds to the cathode 18, and a rotation direction of the circularly polarized light 280 is reversed (a reversed circularly polarized light 290) while the circularly polarized light 280 is being reflected on the cathode. Then, the reversed circularly polarized light 290 is passed through the ¼ retardation plate 32. In this case, since the light 300 passed through the ¼ retardation plate 32 becomes a polarized light that may penetrate the reflective polarizer film, the polarized light is emitted outwards after sequentially passing through the reflective polarizer film 33 and the linear polarizer 32. In this process, a significant proportion of the externally incident light absorbs and approximately 15% of the externally incident light is finally emitted outwards.

Next, considering the light that is emitted from the emissive layer, the light emitted from the emissive layer is passed through respective layers of the OLED, and then penetrates the ¼ retardation plate 32 and reaches the reflective polarizer film 33. Some of the light penetrates the reflective polarizer film 33 (a penetrated light 410), and some of the light is reflected on the reflective polarizer film 33 (a reflected light 420). Then, the reflected light 420 penetrates the ¼ retardation plate 32 again. Since the light 410 penetrating the reflective polarizer film 33 may penetrate the linear polarizer 34, the penetrated light 410 penetrates the linear polarizer 34, and is emitted outwards. On the contrary, the light 420 reflected on the reflective polarizer film is converted into a circularly polarized light 430 while being passed through the ¼ retardation plate. Then, the circularly polarized light 430 is passed through the respective layers of the OLED, and is then reflected on the metallic cathode 18. A rotation direction of the circularly polarized light 430 is reversed (a reversed circularly polarized light 440) while the circularly polarized light 430 is being reflected on the metallic cathode 18. Then, the reversed circularly polarized light 440 is re-passed through the respective layers of the OLED, and is then converted into a linearly polarized light 450 while being passed through the ¼ retardation plate 32. In this case, since a rotation direction of the circularly polarized light is reversed by the reflection, the linearly polarized light 450 formed after the penetration of the ¼ retardation plate 32 is a polarized light that may penetrate the reflective polarizer film. Therefore, the linearly polarized light 450 is emitted outwards after sequentially passing through the reflective polarizer film and the linear polarizer. Since the light emitted from the emissive layer may be theoretically completely emitted outwards through the above-mentioned procedures, it is possible to highly improve the brightness of the OLED.

When the polarizer according to one exemplary embodiment of the present invention is used for OLED as described above, the OLED may have a highly improved light use efficiency and brightness, compared to the conventional OLEDs, since it may be used to highly improve the emission efficiency of light emitted from the emissive layer and also to minimize the reflection of the externally incipient light by inducing the absorption of the externally incipient light into the linear polarizer to the maximum.

Meanwhile, the polarizer for OLED according to one exemplary embodiment of the present invention may include an adhesive layer formed of a color compensation adhesive for decreasing the reflectance of external light, the adhesive layer being formed in The top and bottom of the reflective polarizer film.

The color compensation adhesive is an adhesive having the effect of absorbing a predetermined intensity of light over the entire visible ray range. Here, the color compensation adhesive may be formed by mixing an adhesive resin with a light absorbing agent for absorbing light of visible ray range.

In this case, adhesive resins widely used in the art, for example adhesive resins used in conventional adhesive sheets, adhesive films and the like, may be used as the adhesive resin. For example, adhesive resins that transmit light may be used as the adhesive resin, but the present invention is not particularly limited thereto. Examples of the adhesive resin that may be used herein include an acryl-based resin, a urethane-based resin, a polyisobutylene-based resin, styrene-butadiene rubber (SBR)-based resin, a rubber-based resin, a polyvinylether-based resin, an epoxy-based resin, a melamine-based resin, a polyester-based resin, a phenol-based resin, a silicon-based resin, or copolymers thereof. An acryl-based adhesive is particularly preferred.

Meanwhile, a dye is widely used as the light absorbing agent. The dye that may be used herein, for example, include a black dye, but the present invention not particularly limited thereto. Therefore, dyes that are dissolved in an organic solvent and show good transparency may be used without any limitations. In addition, dyes, which are formed by mixing other dyes except for the black dye, may also be used instead of the black dye.

In this case, a content of the light absorbing agent in the adhesive resin is preferably in a range of approximately 0.001 to 1 part by weight, based on 100 parts by weight of the adhesive resin. When the content of the light absorbing agent is less than 0.001 parts by weight, a color compensation property may be insufficiently presented, whereas, when the content of the light absorbing agent exceeds 1 part by weigh, the transmittance may be severely decreased.

Meanwhile, when compounds have an absorption wavelength at a visible ray range, any of the compounds may be used without limitation as the light absorbing agent. Preferably, a single black dye or a mixture of colored dyes may be used as the light absorbing agent. Here, the single black dye functions to broadly absorb light of a wavelength close to the center, 550 nm, of the visible ray range, that is, a wavelength of 450 to 650 nm, and more preferably 500 to 600 nm. More particularly, the use of the single black dye is desirable, and a dye mixture having a wide absorption wavelength is also suitable. In particularly, unlike the natural light, light having a specific wavelength range is emir ted from light sources of R, G and B in the case of the OLED. In this consideration, it is more preferred to use dyes that do not absorb light of the specific wavelength ranges emitted from the OLEDs but absorb visible light having a wavelength range excluding the specific wavelength ranges. For example, when there is a dye that may more effectively absorb light of the visible wavelength range except for the spectic R, G and B wavelength range of the OLED, the dye may be used to effectively enhance the transmission of internal light of the OLED, and to absorb a certain level of external light as well. Therefore, the dyes may be very effectively used as a color compensation dye for adhesives. When it is assumed that a wavelength center of the R is 460 nm, a wavelength center of the G is 530 nm and a wavelength center of the B is 620 nm, a transmission spectrum, which may absorb light of relatively wide wavelength close to 500 and 580 nm wavelengths, which are out of the wavelength ranges of the R, G and B, is desirable to be used. For this purpose, a dye mixture, which is obtained by mixing a dye having an absorption wavelength range close to 500 nm wavelength, for example, an absorption wavelength range of 480 to 520 nm, and more preferably 490 to 500 nm with a dye having an absorption wavelength range close to 580 cm wavelength, for example, an absorption wavelength range of 570 to 600 nm, and more preferably 580 to 590 cm, may be used as the light absorbing agent.

When the color compensation adhesive including the above-mentioned dyes is used to form an adhesive layer, the entire transmittance of the OLED may be varied to control the transmission of internal light and the reflection of external light. Therefore, the color compensation adhesive may contribute to the improvement in brightness of the internal light and the maintenance of high visibility of the OLED.

As described above, when the adhesive layer is formed of a color compensation adhesive containing a light absorbing agent to absorb light, the polarizer for OLED may be useful to further enhance the contrast by absorbing internal reflected light onto the adhesive layer.

MODE FOR INVENTION

Hereinafter, exemplary embodiment of the present invention will be described in more detail.

Example 1

A conventional linear polarizer, which was obtained by stacking TAC protective films on upper and lower surfaces of a polyvinyl alcohol (PVA) film, was used as a base film. Then, the polarizer having improved brightness according to one exemplary embodiment of present invention was prepared by sequentially attaching a reflective polarizer film (brightness-improving film, 3M) and a 140 nm-thick ¼ wavelength retardation film (a COP elongation film having a normal dispersion characteristic) to a lower surface of the conventional linear polarizer. Here, the reflective polarizer film might transmit a certain linearly polarized light at a transmittance level of 50%. Then, the prepared polarizer was attached to an OLED panel (a 2-inch passive matrix-type OLED panel).

Example 2

A conventional linear polarizer, which was obtained by stacking TAC protective films on upper and lower surfaces of a PVA film, was used as a base film. Then, a reflective polarizer film (brightness-improving film, 3M) that might transmit a certain linearly polarized light at a transmittance level of 50% was attached to a lower surface of the conventional linear polarizer. Then, a color compensation adhesive whose transmittance is adjusted to a level of 80% was prepared by adding a black dye to an acryl-based adhesive (a mixing ratio=100: 0.02), and the reflective polarizer film was coated with the color compensation adhesive to form a color compensation adhesive layer. Then, a 140 nm-thick ¼ wavelength retardation film (a COP elongation film having a normal dispersion characteristic) was attached onto the color compensation adhesive layer to prepare a polarizer having improved brightness according to one exemplary embodiment of the present invention. Finally, the prepared polarizer was attached to an OLED panel (a 2.2-inch active matrix-type OLED panel).

COMPARATIVE EXAMPLE 1

For comparison, an OLED panel (a 2.2-inch passive matrix-type OLED panel) to which the polarizer was not attached was used herein.

COMPARATIVE EXAMPLE 2

A conventional circular polarizer consisting of a conventional linear polarizer and a 140 nm-thick ¼ wavelength retardation film (a COP elongation film having a normal dispersion characteristic) was attached to an OLED panel. Here, the conventional linear polarizer was obtained by stacking TAC protective films on upper and lower surfaces of a PVA film.

EXPERIMENTAL EXAMPLE 1

The OLED panels prepared in Examples 1 to 2 and Comparative examples 1 and 2 were measured for brightness and reflectance.

The brightness was calculated after the intensity of light emitted during the driving of each OLED panel was measured according to the wavelengths. Here, the brightness ratios of the OLEDs were listed in the parentheses, provided that it was assumed that the intensity of light emitted from the OLED panel (Comparative example 1) to which the polarizer was not attached was 100%.

Meanwhile, the reflectance was calculated by measuring the intensity of light reflected on the front side of each OLED panel using a UV spectrometer. Here, the reflectance ratios of the OLEDs were listed in the parentheses, provided that it was assumed that the reflectance of the OLED panel (Comparative example 1) to which the polarizer was not attached was 100%.

The measurement results are listed in the following Table 1.

TABLE 1

|  | Brightness, cd/A (%) | Reflectance, AU (%) |
| --- | --- | --- |
| Comparative example 1 | 19.8 (100) | 69.40 (100) |
| Comparative example 2 | 8.6 (43.4) | 3.76 (5.4) |
| Example 1 | 15.7 (79.3) | 26.03 (37.5) |
| Example 2 | 12.8 (64.6) | 10.81 (15.6) |

As listed in Table 1, it was revealed that, when the conventional circular polarizer prepared in Comparative example 2 was used in the OLED panel, the OLED panel had a brightness of merely 43.4%, but, when the polarizers prepared in Examples 1 and 2 were used respectively in the OLED panels, the OLED panels had highly improved rightness of 79.3% and 64.6%, respectively. Also, it was revealed that the OLED panel of Example 2 having an adhesive layer formed therein had a good reflectance up to a level of 15%. That is, it was seen that both the brightness and contrast ratio of the OLED panel were highly improved when the polarizer according to one exemplary embodiment of the present invention was used in the OLED panel.

The invention claimed is:

1. A polarizer for organic light emitting diodes (OLED) having improved brightness, which comprises
a linear polarizer,
a ¼ retardation plate,
a reflective polarizer film disposed between the linear polarizer and the ¼ retardation plate and transmitting a horizontally polarized light to the transmission axis of the linear polarizer while reflecting a vertically polarized light to the transmission axis of the linear polarizer, and
one or more adhesive layer formed at least one of the top and bottom of the reflective polarizer film,
wherein at least one out of the adhesive layers is formed of a color compensation adhesive for decreasing the reflectance of external light, and the color compensation adhesive comprises 100 parts by weight of an adhesive resin and 0.01 to 1 part by weight of a light absorbing agent.

2. The polarizer of claim 1, wherein the light absorbing agent is selected from the group consisting of an acryl-based resin, a urethane-based resin, a polyisobutylene-based resin, a styrene-butadiene rubber (SBR)-based resin, a rubber-based resin, a polyvinylether-based resin, an epoxy-based resin, a melamine-based resin, a polyester-based resin, a phenol-based resin, a silicon-based resin, and copolymers thereof.

3. The polarizer of claim 1, wherein the light absorbing agent is a black dye.

4. The polarizer of claim 3, wherein the black dye has an absorption wavelength of 500 to 600 nm.

5. An OLED device, comprising the polarizer having improved brightness defined in claim 1.

* * * * *